United States Patent
Zhang

(10) Patent No.: US 9,043,685 B2
(45) Date of Patent: May 26, 2015

(54) METHOD AND APPARATUS FOR ERROR-CORRECTION IN AND PROCESSING OF GFP-T SUPERBLOCKS

(75) Inventor: Xiaoning Zhang, St. John's (CA)

(73) Assignee: Altera Canada Co., Halifax, Nova Scotia (CA)

( * ) Notice: Subject to any disclaimer, the term of this patent is extended or adjusted under 35 U.S.C. 154(b) by 367 days.

(21) Appl. No.: 12/656,631

(22) Filed: Feb. 5, 2010

(65) Prior Publication Data

US 2011/0197111 A1     Aug. 11, 2011

(51) Int. Cl.
| | |
|---|---|
| *G06F 11/00* | (2006.01) |
| *H04L 1/00* | (2006.01) |
| *H03M 13/09* | (2006.01) |
| *H03M 13/15* | (2006.01) |

(52) U.S. Cl.
CPC ........... *H04L 1/0053* (2013.01); *H03M 13/091* (2013.01); *H03M 13/151* (2013.01); *H04L 1/0057* (2013.01)

(58) Field of Classification Search
USPC ........................................................ 714/785
See application file for complete search history.

(56) References Cited

U.S. PATENT DOCUMENTS

| | | | |
|---|---|---|---|
| 7,260,767 B2 | 8/2007 | Bhattacharya et al. | |
| 2002/0027929 A1 | 3/2002 | Eaves | |
| 2002/0159484 A1 | 10/2002 | Azizoglu | |
| 2003/0185251 A1 | 10/2003 | Ichino et al. | |
| 2006/0041826 A1* | 2/2006 | Bhattacharya et al. | ........ 714/782 |
| 2008/0175072 A1* | 7/2008 | Norman | .................... 365/189.05 |
| 2010/0023840 A1* | 1/2010 | Nakao et al. | .................. 714/763 |
| 2010/0185904 A1* | 7/2010 | Chen | .............................. 714/54 |
| 2011/0161773 A1* | 6/2011 | Martwick et al. | ............. 714/755 |

* cited by examiner

*Primary Examiner* — Sarai Butler
(74) *Attorney, Agent, or Firm* — Ropes & Gray LLP

(57) ABSTRACT

The present invention discloses a method and apparatus for processing and error correction of a GFP-T superblock, where the 64 bytes of payload data of a first superblock are buffered in the first page of a two-page buffer. The flag byte is buffered in a separate buffer, and a CRC operation is performed in a separate logic element. The result of the CRC operation is checked against a single syndrome table which may indicate single- or multi-bit errors. As the payload data of the first superblock is processed and read out of the first page of the two-page buffer, the payload data of a second superblock is written into the second page of the two-page buffer to be processed and corrected.

21 Claims, 4 Drawing Sheets

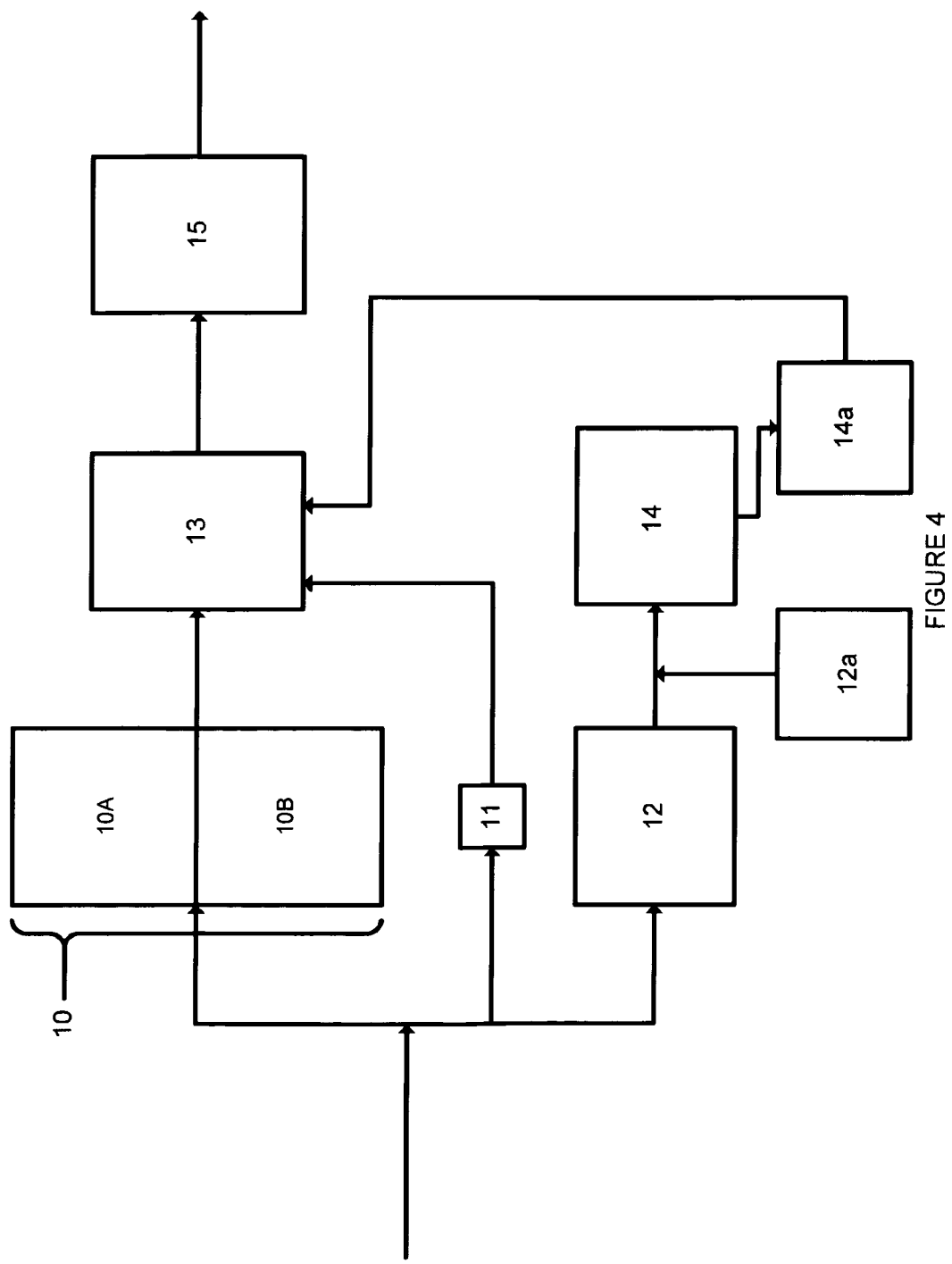

METHOD AND APPARATUS FOR ERROR-CORRECTION IN AND PROCESSING OF GFP-T SUPERBLOCKS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

Ratified in 2001, the International Telecommunication Union (ITU-T) recommendation G.7041 addresses the need for a generic method of mapping client signals for transmission over a transport network. In the interest of interoperability, the generic framing procedure (GFP) as defined by G.7041 allows client signals to be mapped into a framed payload suitable for Synchronous Digital Hierarchy (SDH) virtual containers (VCs) as well as Optical Transport Network (OTN) Optical Data Units (ODUs).

As illustrated in FIG. 1, the basic structure of a frame created under GFP consists of a four-byte core header and a payload area of up to 65535 bytes. Two bytes of the core header (1) are dedicated to a Payload Length Indicator (PLI) which indicates the size of the appended payload area. The other two bytes (2) comprise the Core Header Error Correction (cHEC) field, containing a 16-bit Cyclic Redundancy Check (CRC) code which enables single- and multi-bit error correction. The payload area consists of a payload header (3) which can vary in size from 4 to 64 bytes and carries two bytes of information indicating the type of payload contained within the payload area as well as a 16-bit CRC HEC to protect the type field, and an additional 0 to 62 bytes which can contain information specific to the technology of the transport network over which the frame is to be transmitted. The remainder of the payload area (4) is comprised of the payload information field itself, containing the client signal to be encoded and framed under GFP as well as an additional four-byte payload Frame Check Sequence (pFCS) that comprises a 32-bit CRC code to protect the integrity of the payload information area.

The GFP outlined above, however, is not sufficient to encompass the needs of all network applications; these applications are broadly divided into those which the recommendation defines as either Protocol Data Unit (PDU) oriented, or block-code oriented. PDU-oriented applications such as Internet Protocol (IP) or Point-to-Point Protocol (PPP) rely on the transport of discrete, individually-framed packets of information. For these applications, G.7041 recommends Frame-Mapped GFP (GFP-F), a subset of GFP wherein the client frame is adapted to that of the recommendation in a "frame-by-frame mapping of the client payload" into the GFP payload information area (G.709, page 29). Other block-coded applications, however, such as Gigabit Ethernet (GbE), deal in high-volume transport of data, and thus are susceptible to small amounts of latency in transmission; for these applications, the frame-by-frame mapping of client frames to GFP frames in GFP-F would create intolerable wait times in transmission as network elements worked on each individual client frame. For those applications which require a constant streaming of encoded data, a different type of GFP is required.

Transparent-mapped GFP (GFP-T) is designed to meet the needs of these low-latency applications. In GFP-T, the stream of 8-bit/10-bit (8 B/10 B) block-encoded characters utilised by such high-speed, low-latency applications as GbE is mapped into a fixed-size 64-bit/65-bit (64 B/65 B) payload information area, irrespective of the size of the client frame itself. The 8 B/10 B characters are decoded and then encoded in 64 B/65 B code. Each line of 64 B/65 B code contains eight bytes (64 bits) of decoded 8 B/10 B payload information as well as a single leading bit (flag bit) which indicates whether or not the included payload information contains any control codes. The payload information area of each GFP-T frame contains a plurality of "superblocks," illustrated in FIG. 2, wherein each superblock consists of eight 64 B/65 B codes, and each code is further broken down into a set of eight one-byte "words." Each superblock therefore consists of 64 bytes of payload data and a single octet of flag bits which are grouped together as a trailing byte. Following the trailing byte is a 16-bit CRC code to protect the integrity of the superblock. The number of superblocks contained in the GFP-T frame is dependent upon the "base, uncoded rate of the client signal and on the transport channel capacity" (G.709, page 45). The minimum size of a GFP-T frame contains a single superblock, and accommodates a client signal rate of 160 Mb/s; to fulfil the needs of GbE, wherein the transport network operates at a rate of one Gb/s, a minimum of 95 superblocks per frame are required. These high rates of transmission are indicative of the pressing need to reduce the latency in processing the GFP-T frames, on both transmit and receive sides of the network.

Compounding the issue of latency is the dependence of GFP upon 16- and 32-bit CRC codes to maintain the integrity of both headers and payload. When payload data is encoded, the binary information is run through a particular polynomial to produce a checksum, or CRC code, which represents the remainder of a quotient after the polynomial has been divided by a particular divisor; the CRC code is then appended to the payload information and transmitted with the frame. At the receive side, as the information is decoded, the binary information is run through the polynomial once more, and the results are checked against a syndrome table to ensure that the received value matches the expected value. If the received value does not match the expected value, it may indicate either a single- or multi-bit error. Thus it is necessary to process the CRC codes and compare the incoming data with the expected results. In particular, such an apparatus must specifically address the superblock, as every GFP-T frame consists of a plurality of said superblocks, each with its own 16-bit CRC code.

The prior art includes methods by which the superblocks of a GFP-T frame and the appended CRC codes may be processed. Specifically, the prior art illustrated in FIG. 3 addresses these needs by implementing an eight-by-eight byte buffer (5) to hold the 64 bytes of payload data in the superblock, a buffer to hold the octet of flag bits (6), and a three-stage method of error correction, which consists of three separate checks for the remainder of a CRC calculation performed by a CRC calculation circuit (7) against two separate syndrome tables, one for single bit errors (8) and one for multi-bit errors (9). While this method is sufficient for older transport networks, recent developments in technology have permitted higher speeds of transmission including 10 GbE, 40 GbE, and 100 GbE. These higher rates of transmission are more sensitive to the effects of latency, and thus the prior art is insufficient in addressing the needs of contemporary transport networks. Thus it is necessary to produce a means by which the superblocks of a GFP-T frame may be processed and undergo error correction while reducing latency.

BRIEF SUMMARY OF THE INVENTION

It is an object of the present invention to provide a method and apparatus for receive-side error correction in a GFP-T superblock.

It is also an object of the present invention to provide a method and apparatus for processing and error correction in a GFP-T superblock which minimizes latency.

The present invention addresses these objects by disclosing a method and apparatus for processing and error correction of a GFP-T superblock, where the 64 bytes of payload data of a first superblock are buffered in the first page of a two-page buffer. The flag byte is buffered in a separate buffer, and a CRC operation is performed in a separate logic element. The result of the CRC operation is checked against a single syndrome table which may indicate single- or multi-bit errors. As the payload data of the first superblock is processed and read out of the first page of the two-page buffer, the payload data of a second superblock is written into the second page of the two-page buffer to be processed and corrected. Thus the present invention addresses the objects of reducing latency in processing and correcting GFP-T superblocks by eliminating the plurality of syndrome tables against which the result of the CRC operation is compared and allowing a continuous stream of data into and out of the two-page buffer, reducing wait times for the buffered data.

BRIEF DESCRIPTION OF THE DRAWINGS

FIG. 4 is a block diagram illustrating the circuitry of an illustrative embodiment of the present invention.

DETAILED DESCRIPTION OF AN EMBODIMENT OF THE INVENTION

Figure 1:
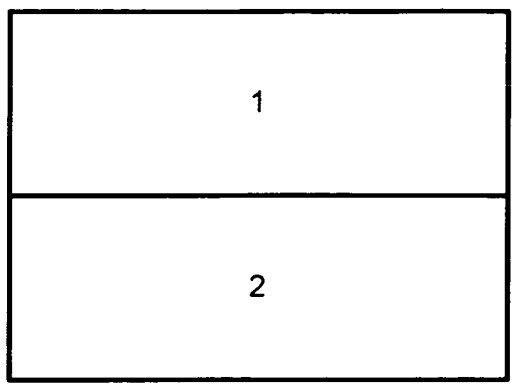
FIG. 1 is a diagram illustrating the basic structure of a GFP frame.
Figure 1:
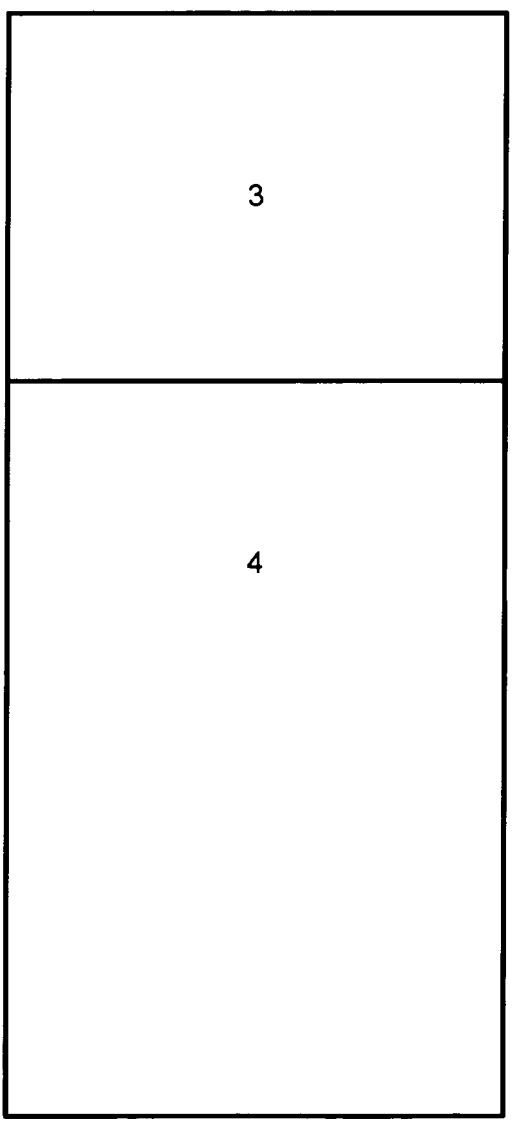
Figure 2:
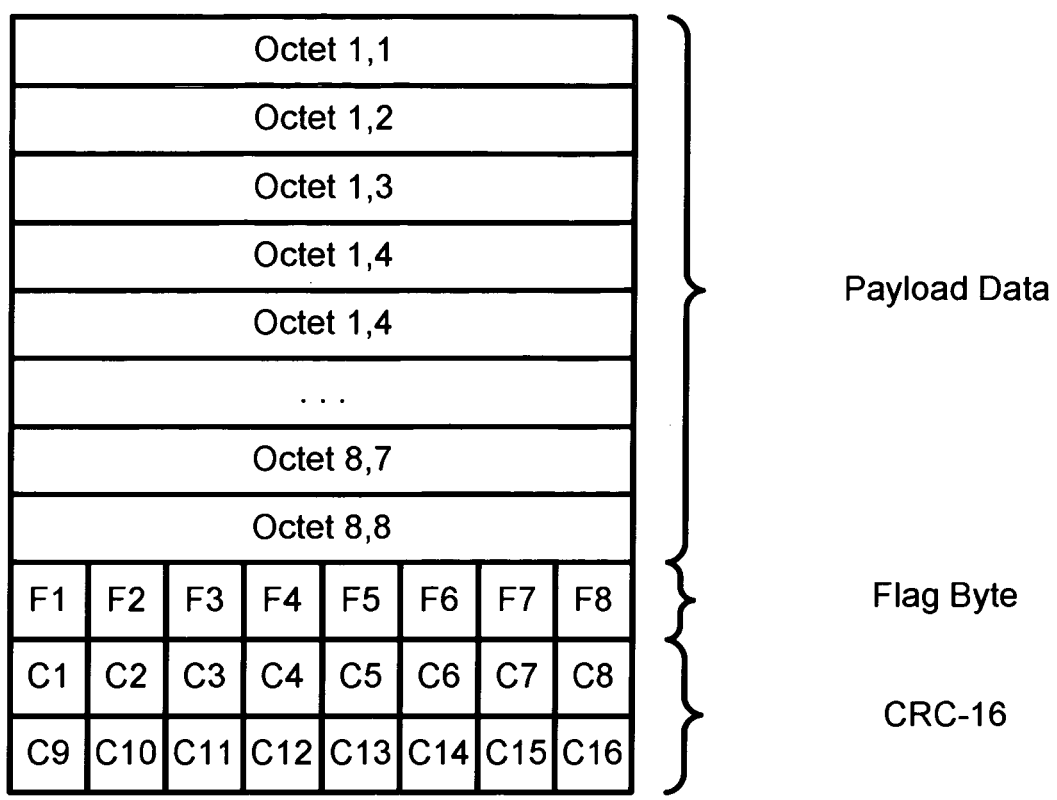
FIG. 2 is a diagram illustrating the structure of a GFP-T superblock.
Figure 3:
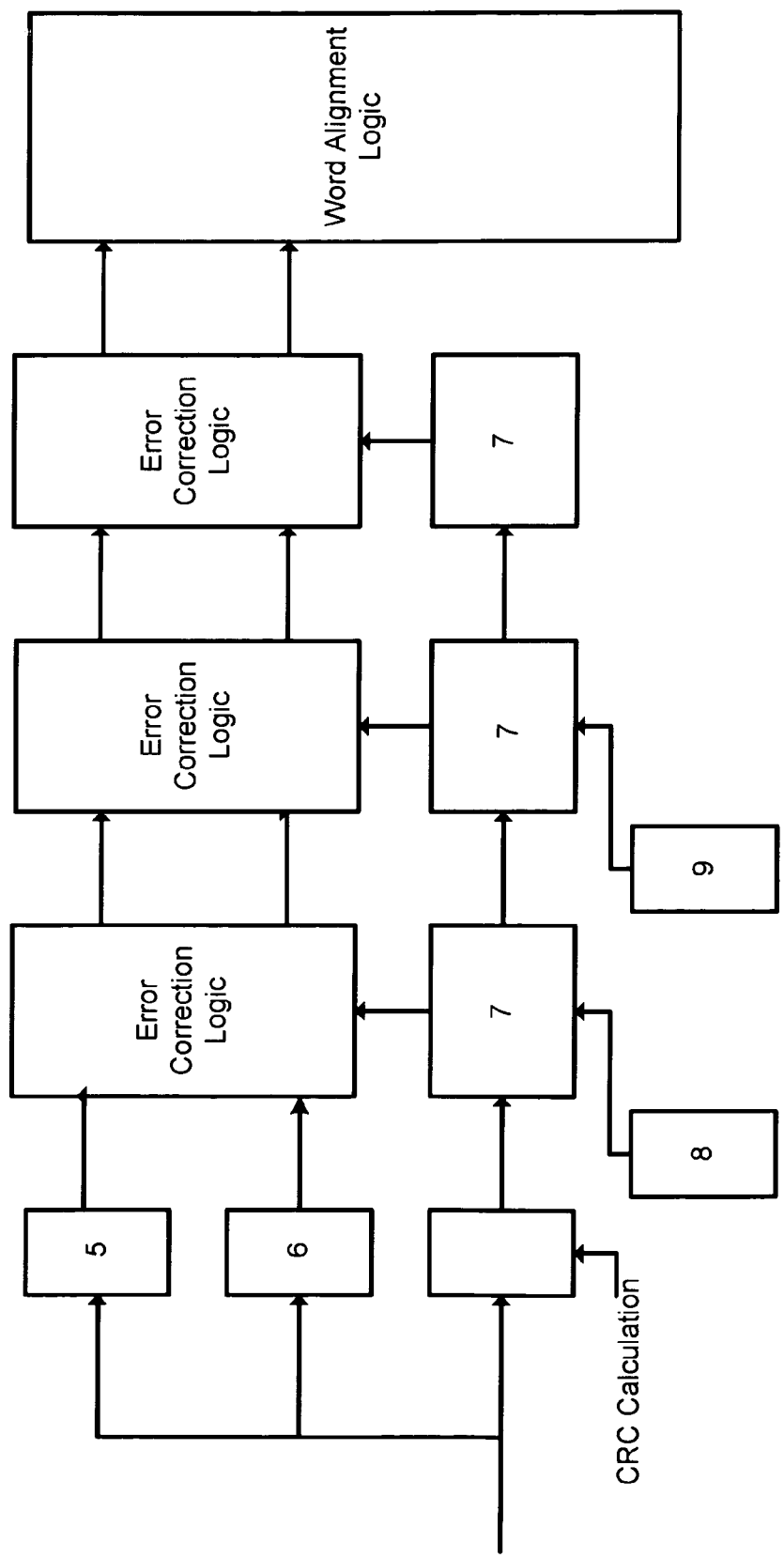
FIG. 3 is a block diagram illustrating an embodiment of the prior state of the art, a receive-side apparatus for correcting errors in a GFP-T superblock.

The present invention discloses a method and apparatus for error correction of GFP-T superblocks; the invention comprises buffering the payload data of an incoming GFP-T superblock in one page of a two-page buffer, buffering the flag byte of said incoming GFP-T superblock in a separate flag byte buffer, and performing a CRC calculation in a CRC calculation circuit. As data is read out of the first page of said dual-page buffer and into an error-correction module, each byte is checked against the CRC operation via a comparison with a syndrome table, and if bit errors are present, the data is corrected. As these bytes are read out of the first page of the dual-page buffer, the payload data of the subsequent GFP-T superblock is written into the second page of the dual-page buffer.

An illustrative embodiment of the present invention is shown in FIG. 4; it should be noted that this illustrative embodiment is provided for exemplary purposes only and is not intended to limit the scope of the invention. FIG. 4 illustrates a receiver-side apparatus for error correction of GFP-T superblocks in the payload of an ODU0 frame. The payload of said ODU0 frame is a one GbE client signal, and thus contains at least 95 GFP-T superblocks, as per G.7041. As defined in the standard, each superblock consists of 64 bytes of 64 B/65 B-encoded payload data, and a single flag byte which contains realignment information as well as information pertaining to the presence or absence of control codes in each eight byte line of 64 B/65 B code. There is also a 16-bit CRC code appended to each superblock for error correction purposes, where the CRC code is generated from the polynomial $G(x)=x^{16}+x^{15}+x^{12}+x^{10}+x^4+x^3+x^2+x+1$.

As illustrated, upon reception of the ODU0 frame, the payload data of the first superblock is written into a buffer (10). This buffer consists of 128 bytes of RAM, partitioned into two equal pages of 64 bytes each. The first GFP-T superblock payload is consequently written into the first 64 byte partition or page (10A). As each byte of payload data is written into the first page, a first logic element (12) concurrently performs a CRC calculation upon that byte. Once the payload data has been written into the buffer (10), the trailing flag byte at the end of the block is written into the flag byte buffer (11). As the flag byte is written into the flag byte buffer (11), the first logic element (12) performs a CRC calculation upon that byte. Once all 64 bytes of payload data as well as the flag byte have been written into the first buffer (10) and the flag byte buffer (11), the 16-bit CRC code is written into the first logic element (12), wherein the first logic element performs a CRC calculation upon those two bytes. Thus the first logic element (12) performs a CRC calculation on all 67 bytes of data in the GFP-T superblock to produce a CRC remainder, the CRCRX2. This result is then checked against a syndrome table (14); if there are any discrepancies between the results of the bytewise CRC calculation and the syndrome table (14), the syndrome table indicates the location of error bits in the payload data that may have caused the discrepancy. The syndrome table can indicate one bit error or two bit errors as far as 43 bits apart from each other. The syndrome table can also indicate the presence of multi-bit errors, but not the location of those errors.

Each byte in the first page (10A) of the buffer (10) is then read out of the first page (10A), and written into a second logic element (13). As each byte of payload data stored on the first page (10A) of the first buffer (10) is written into the second logic element (13), the second logic element corrects any error bits in the data in accord with the information from the syndrome table (14). After being corrected in the second logic element (13), each byte of payload data is written into the realignment module (15), where the data is decoded into 8 B/10 B code and realigned in accord with the flag byte in the flag byte buffer (11). This bytewise error correction continues until all 64 bytes of payload data in the first GFP-T superblock have been corrected, written into the realignment module, and aligned in accord with the flag byte.

As the payload data of the first superblock is read out of the first page (10A) of the buffer (10), the payload data of the second GFP-T superblock is concurrently written into the second page (10B) of the buffer (10). This concurrent read in/write out of data ensures a constant flow of data into and out of the buffer (10) with minimal latency.

Once the data in the realignment module has been aligned and decoded back into 8 B/10 B code, it is transferred to a processor (16) to be further processed, whether it is to be written into another frame or some other application. Thus the present invention performs error correction and processing of GFP-T superblocks in a manner which minimizes potential latency by employing a single-stage bytewise error correction process. The present invention also processes GFP-T superblocks in a manner which reduces latency by employing a two-page buffering system. These two innovations guarantee both a high degree of accuracy in the received data as well as a constant flow of data.

What is claimed is:

1. A method for performing error correction and processing of a data signal in a data transmission system, wherein said data signal comprises a plurality of fixed-length blocks of data, and wherein each of said plurality of fixed-length blocks of data is comprised of payload data, realignment data, and error-correction data, the method comprising:
   storing, in a first page of a plurality of pages of a first buffer, said payload data of one of said plurality of fixed-length blocks of data, wherein said first buffer is comprised of the plurality of pages, wherein each of said plurality of pages can store said payload data of one of said plurality of fixed-length blocks of data;
   storing, in a second buffer, said realignment data of one of said plurality of fixed length blocks of data;
   performing, using a first logic element, a first error-correction calculation upon said payload data stored in the first page concurrently as said payload data is stored in the first page;
   performing, using the first logic element, at least a second error-correction calculation upon said realignment data and said error-correction data of one of said plurality of fixed-length blocks of data, whereby a result is obtained from said first and second error correction calculations;
   comparing a syndrome pattern, stored in a single syndrome table, against said result from said first and second error-correction calculations;
   determining, based on the comparison using the single syndrome table, one bit and two bit errors in one of said plurality of fixed-length blocks of data;
   writing, to a second logic element, each byte of said payload data of one of said fixed-length blocks of data from said first buffer, and wherein said payload data is corrected for bit errors in said second logic element according to said comparison between said result and said syndrome pattern; and
   writing, to a third logic element, said payload data from said second logic element after said payload data has been corrected for bit errors, whereby said payload data is realigned according to said realignment data of one of said fixed-length blocks of data in said second buffer, and wherein said payload data of one of said fixed-length blocks of data is read out of said first buffer at the same time that payload data of a next consecutive fixed-length block of data is read into said first buffer.

2. The method of claim 1, wherein said plurality of fixed-length blocks of data is comprised Of a plurality of transparent-mapped Generic Framing Procedure (GFP-T) superblocks.

3. The method of claim 2, wherein each of said plurality of GFP-T superblocks is comprised of 64 bytes of payload data, one byte of realignment data, and two bytes of error correction data.

4. The method of claim 1, wherein each of said first error-correction calculation and second error-correction calculation is a Cyclic Redundancy Check (CRC) calculation.

5. The method of claim 1, wherein said payload data of one of said fixed-length blocks of data is read out of one of said pages of said first buffer and written into said second logic element at the same time that payload data of a next consecutive fixed-length block of data is read into a next consecutive page of said first buffer.

6. An apparatus for performing error correction and processing of data in a data transmission system, the system comprising:
   a data signal, wherein said data signal is comprised of a plurality of fixed-length blocks of data, wherein each of said plurality of fixed-length blocks of data is comprised of payload data, realignment data, and error-correction data;
   a first page of a plurality of pages of a first buffer to store said payload data of one of said plurality of fixed-length blocks of data, wherein said first buffer is comprised of the plurality of pages, wherein each of said plurality of pages can store said payload data of one of said plurality of fixed-length blocks of data;
   a second buffer to store said realignment data of one of said plurality of fixed length blocks of data;
   a first logic element to perform an error-correction calculation upon:
      said payload data stored in the first page concurrently as said payload data is stored in the first page;
      said realignment data and said error-correction data of one of said plurality of fixed-length blocks of data, whereby a result is obtained from said error-correction calculation;
   a single syndrome table comprising a syndrome pattern for:
      comparing the syndrome pattern against said result from said error-correction calculation, and
      determining, based on the comparison, one bit and two bit errors in one of said plurality of fixed-length blocks of data;
   a second logic element, wherein each byte of said payload data of one of said fixed-length blocks of data is written to said second logic element from said first buffer, and wherein said payload data is corrected for bit errors in said second logic element according to said comparison between said result of said error-correction calculation and said syndrome pattern;
   a third logic element, wherein said payload data is written to said third logic element from said second logic element after said payload data has been corrected for bit errors, whereby said payload data is realigned according to said realignment data of one of said fixed-length blocks of data in said second buffer, and wherein said payload data of one of said fixed-length blocks of data is read out of said first buffer at the same time that payload data of a next consecutive fixed-length block of data is read into said first buffer.

7. The apparatus of claim 6, wherein said plurality of fixed-length blocks of data is comprised of a plurality of transparent-mapped Generic Framing Procedure (GFP-T) superblocks.

8. The apparatus of claim 7, wherein each of said plurality of GFP-T superblocks is comprised of 64 bytes of payload data, one byte of realignment data, and two bytes of error correction data.

9. The apparatus of claim 7, wherein said first buffer is comprised of a first page and a second page.

10. The apparatus of claim 7, wherein said first buffer is comprised of 128 bytes of memory, whereby said 128 bytes of memory are partitioned into two 64-byte pages of memory.

11. The apparatus of claim 6, wherein said second buffer is comprised of eight bytes of memory.

12. The apparatus of claim 6, wherein said error-correction calculation is a Cyclic, Redundancy Check (CRC) calculation.

13. The apparatus of claim 7, wherein payload data of a second fixed-length block of data is written into said second page of said first buffer at the same time that payload data of a first fixed-length block of data is read out of said first page of said first buffer and written into said second logic element.

14. A circuit for performing error correction and processing of a data signal in a data transmission system, wherein the data signal comprises a plurality of fixed-length blocks of data, and wherein each of the plurality of fixed-length blocks of data comprises payload data, the circuit comprising:
   a first buffer comprising a plurality of pages, wherein a first page of the plurality of pages stores payload data of a first of the plurality of fixed-length blocks of data, and wherein the payload data of the first of the plurality of fixed-length blocks of data is read from the first page of the plurality of pages at the same time as payload data of a second of the plurality of fixed-length blocks of data is written to a second page of the plurality of pages;
   a first logic element for computing an error-correction calculation on the plurality of fixed-length blocks of data, wherein the error-correction calculation is performed upon a first portion of one of the plurality of fixed-length blocks of data concurrently as the first portion of the one of the plurality of fixed-length blocks of data is stored in the first page;
   a single syndrome table comprising a syndrome pattern for:
      comparing the syndrome pattern against a result of the error-correction calculation, and
      determining, based on the comparison, one bit and two bit errors in one of said plurality of fixed-length blocks of data;
   a second logic element operative to correct bit errors determined from the comparison between the syndrome pattern and the result of the error-correction calculation, wherein the payload data of the first of the plurality of fixed-length blocks of data is corrected by the second logic element.

15. The circuit of claim 14, wherein the plurality of fixed-length blocks of data comprises a plurality of transparent-mapped Generic Framing Procedure (GFP-T) superblocks.

16. The circuit of claim 15, wherein each of the plurality of GFP-T superblocks comprises 64 bytes of payload data, one byte of realignment data, and two bytes of error correction data.

17. The circuit of claim 15, wherein the first buffer comprises 128 bytes of memory, wherein the 128 bytes of memory are partitioned into two 64-byte pages of memory.

18. The circuit of claim 14 further comprising a second buffer comprising eight bytes of memory, wherein the second buffer is operative to store realignment data of one of the plurality of fixed length blocks of data, wherein each of the plurality of fixed-length blocks of data comprises realignment data.

19. The circuit of claim 18 further comprising a third logic element, wherein the payload data is written to the third logic element from the second logic element after the payload data has been corrected for bit errors, and wherein the payload data is realigned according to the realignment data of one of the fixed-length blocks of data in the second buffer.

20. The circuit of claim 14, wherein the error-correction calculation is a Cyclic, Redundancy Check (CRC) calculation.

21. The method of claim 1 further comprising determining locations of one bit and two bit errors in one of said plurality of fixed-length blocks of data based on the comparison.

* * * * *